United States Patent [19]
Lakhani

[11] Patent Number: 6,115,291
[45] Date of Patent: *Sep. 5, 2000

[54] HEALING CELLS IN A MEMORY DEVICE

[75] Inventor: Vinod Lakhani, Milpitas, Calif.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/222,521

[22] Filed: Dec. 29, 1998

[51] Int. Cl.[7] .................................................. G11C 16/00
[52] U.S. Cl. .................................. 365/185.3; 365/185.09; 365/185.22
[58] Field of Search ........................... 365/185.3, 185.29, 365/185.22, 185.09

[56] References Cited

U.S. PATENT DOCUMENTS

| | | | |
|---|---|---|---|
| 5,237,535 | 8/1993 | Mielke et al. | 365/185.22 |
| 5,579,356 | 11/1996 | Chevallier | 377/20 |
| 5,608,672 | 3/1997 | Tang et al. | 365/185.3 |
| 5,615,159 | 3/1997 | Roohparvar | 365/201 |
| 5,619,454 | 4/1997 | Lee et al. | 365/185.3 |
| 5,627,784 | 5/1997 | Roohparvar | 365/189.01 |
| 5,629,644 | 5/1997 | Chevallier | 327/393 |
| 5,673,224 | 9/1997 | Chevallier et al. | 365/185.23 |
| 5,677,885 | 10/1997 | Roohparvar | 365/201 |
| 5,694,366 | 12/1997 | Chevallier et al. | 365/207 |
| 5,822,252 | 10/1998 | Lee et al. | 365/185.23 |
| 5,856,944 | 1/1999 | Prickett, Jr. et al. | 365/185.3 |

*Primary Examiner*—Tan T. Nguyen
*Attorney, Agent, or Firm*—Schwegman, Lundberg, Woessner & Kluth, P.A.

[57] ABSTRACT

Healing cells in a memory device. According to one embodiment of the present invention a heal operation is performed on a plurality of cells in the memory device, a number of subsets of the cells that are leaking is counted where a subset of cells that is leaking includes a cell that conducts more than a predetermined amount of current when not being activated, and another heal operation is performed on the cells based on the number of subsets of the cells that are leaking.

43 Claims, 8 Drawing Sheets

HEALING CELLS IN A MEMORY DEVICE

FIELD OF THE INVENTION

The present invention relates generally to memory devices, and more particularly, to performing a heal operation on cells in a memory device.

BACKGROUND

Electrically erasable and programmable memory devices having arrays of what are known as flash cells are found in a wide variety of electrical devices. A flash cell, also called a floating gate transistor memory cell, is similar to a field effect transistor, having a channel region between a source and a drain and a control gate over the channel region. In addition the flash cell has a floating gate between the control gate and the channel region. The floating gate is typically separated from the channel region by a layer of gate oxide, and an inter-poly dielectric layer typically separates the control gate from the floating gate. Both the control gate and the floating gate are typically formed of doped polysilicon. The floating gate remains floating or electrically isolated. A flash cell is programmed by applying appropriate voltages to the control gate, the drain, and the source to cause electrons to pass from the channel region to the floating gate through the gate oxide. The voltage at the control gate determines the amount of charge residing on the floating gate after programming, and the charge determines the voltage that must be applied to the control gate in order to allow the flash cell to conduct current between the source and the drain. This voltage is termed the threshold voltage of the flash cell, and is the physical form of the data stored in the flash cell. As the charge on the floating gate increases the threshold voltage increases.

An alternative to the above described semiconductor memory device is an electrically erasable and programmable memory device having arrays of multi-bit or multi-state flash cells. Multi-state flash cells have the same structure as ordinary flash cells and are capable of storing multiple bits of data in a single cell. A multi-bit or multi-state flash cell has multiple distinct threshold voltage levels over a voltage range. Each distinct threshold voltage level corresponds to a set of data bits, with the number of bits representing the amount of data which can be stored in the multi state flash cell.

Data is conventionally stored in semiconductor memory devices based on flash cells by programming flash cells that have been previously erased. A flash cell is erased by applying appropriate voltages to the control gate and the source of the flash cell and allowing the drain to float. The electrons in the floating gate are induced to pass through the gate oxide to the source such that the charge in the floating gate is reduced and the threshold voltage of the flash cell is reduced.

Flash cells in an array are conventionally erased in blocks in an erase procedure. Ideally, each erased flash cell in a block has a threshold voltage within a specified voltage range. Unfortunately in each block some flash cells may become overerased after an erase procedure. An overerased flash cell has insufficient negative charge in the floating gate, and in some cases may have a net positive charge in the floating gate, and therefore has a threshold voltage that is too low. The overerased flash cell will be activated with a very low positive voltage applied to the control gate, even as low as a ground voltage, and may leak current even though it is not being read or verified. Leaking current is current that is allowed to pass through the flash cell when the flash cell is not intended to be conductive. The current from leaking flash cells makes it impossible to read other flash cells accurately if they share a bit line, the line connecting the drains of adjacent flash cells to the sense amplifier. The flash cells connected to the same bit line are considered to be in the same column of an array. A leaky column has leaking flash cells connected to the bit line in the column.

Flash cells are read by grounding the source, applying a low positive voltage to the drain and a higher positive voltage to the control gate. If the control gate voltage exceeds its threshold voltage the flash cell will be activated to conduct current. A flash cell that conducts current while being read is in an erased state. If the flash cell is programmed its threshold voltage is high and it will not conduct current while being read. A sense amplifier is used to sense the presence of current through the flash cell. Flash cells are verified as being erased in a verification operation in which the flash cells are read individually in a sequence.

A conventional method 50 of erasing flash cells in an array is shown in FIG. 1. In step 52 an erase pulse is applied to a block of flash cells in the array. A verification operation is performed for the block in step 54 to determine if each of the flash cells in the block has a threshold voltage below a specified threshold voltage. If the erasure of all of the flash cells in the block cannot be determined in step 56, erase pulses are reapplied in step 52 until each of the flash cells in the block has a threshold voltage below the specified threshold voltage.

Some flash cells become overerased due to the repeated application of erase pulses. A heal operation is performed in step 58 to correct overerased flash cells. In the heal operation the drains of the flash cells in a block are left floating, the sources are grounded, and a high voltage pulse, called a heal pulse, is applied to the control gates to draw electrons to the floating gates. Flash cells that have been overerased will draw more negative charge to their respective control gates than the flash cells that were not overerased so that all of the flash cells in the block will have their respective threshold voltage levels raised to a similar level. Several heal pulses may be applied to the block of flash cells to reduce the distribution of threshold voltage levels. Following the application of one or more heal pulses in step 58 the method 50 ends with step 60.

The conventional method 50 of erasing flash cells in an array can result in overheated flash cells in the block. Accordingly, there exists a need for a method of erasing flash cells that minimizes the creation of overhealed flash cells. For these and other reasons, there is a need for the present invention.

SUMMARY OF THE INVENTION

The above mentioned and other deficiencies are addressed in the following detailed description of embodiments of the present invention. According to one embodiment of the present invention a heal operation is performed on a plurality of cells in a memory device, a number of subsets of the cells that are leaking is counted where a subset of cells that is leaking includes a cell that conducts more than a predetermined amount of current when not being activated, and another heal operation is performed on the cells based on the number of subsets of the cells that are leaking.

Advantages of the present invention will be apparent to one skilled in the art upon an examination of the detailed description of the preferred embodiments.

DETAILED DESCRIPTION OF THE PREFERRED EMBODIMENTS

In the following detailed description, reference is made to the accompanying drawings which form a part hereof, and in which are shown, by way of illustration, specific embodiments in which the present invention may be practiced. The embodiments are described in sufficient detail to enable those skilled in the art to practice the present invention. Other embodiments may be used and changes may be made without departing from the scope of the present invention. The following detailed description is, therefore, not to be taken in a limiting sense, and the scope of the present invention is defined only by the appended claims and their equivalents.

In this description a flash cell is described as being activated or switched on when it is rendered conductive by a control gate voltage that exceeds its threshold voltage, and the flash cell is described as being in an inactive state or switched off when the control gate voltage is below the threshold voltage.

The problem that the present invention addresses will now be described. Often there is one flash cell connected to a bit line that will be erased very quickly, i.e., a fast cell. The fast cell will then have a threshold voltage that is too low and will be activated by a low control gate voltage to leak current. A bit line connected to the fast cell will carry the leaking current and function as though all of the flash cells on the bit line are erased in a verify operation. Once a heal pulse is applied, the threshold voltage of the fast cell is corrected and the leakage ends, but the remaining flash cells on the bit line will not be erased. According to a conventional method of operating a memory device with the above-described problem the flash cells not erased will be marked as "overheated" flash cells and will be treated with additional steps appropriate to overheated flash cells. Overhealed cells occur if an excessive heal pulse or too many heal pulses are applied to add too much charge to the floating gates of the cells. An overheated cell has a threshold voltage higher than the threshold voltage of an erased cell. The present invention described herein addresses this problem and provides solutions to other problems not mentioned herein.

Figure 1:
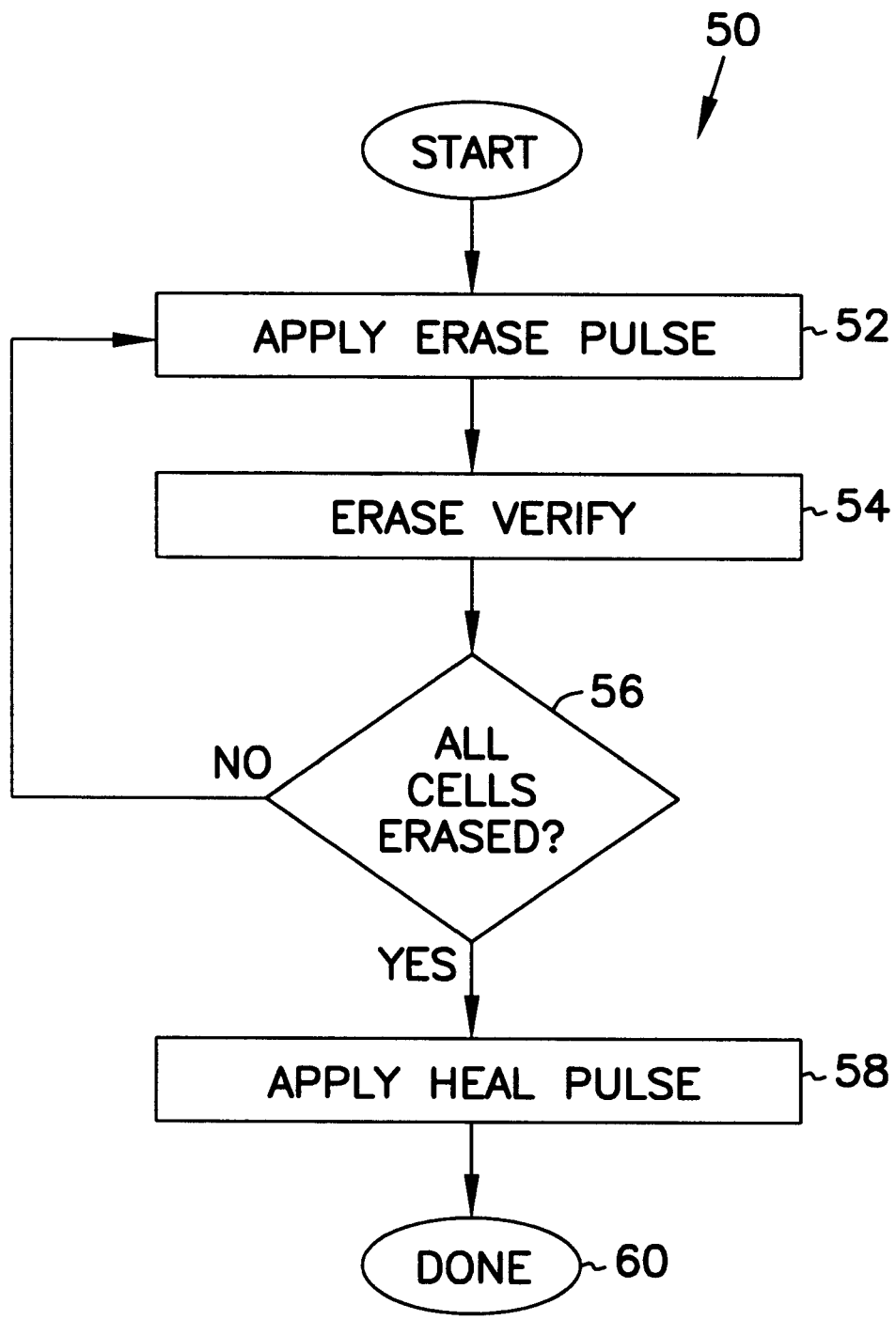
FIG. 1 is a flow chart of a method for erasing a block of cells in a memory system according to the prior art.
Figure 2:
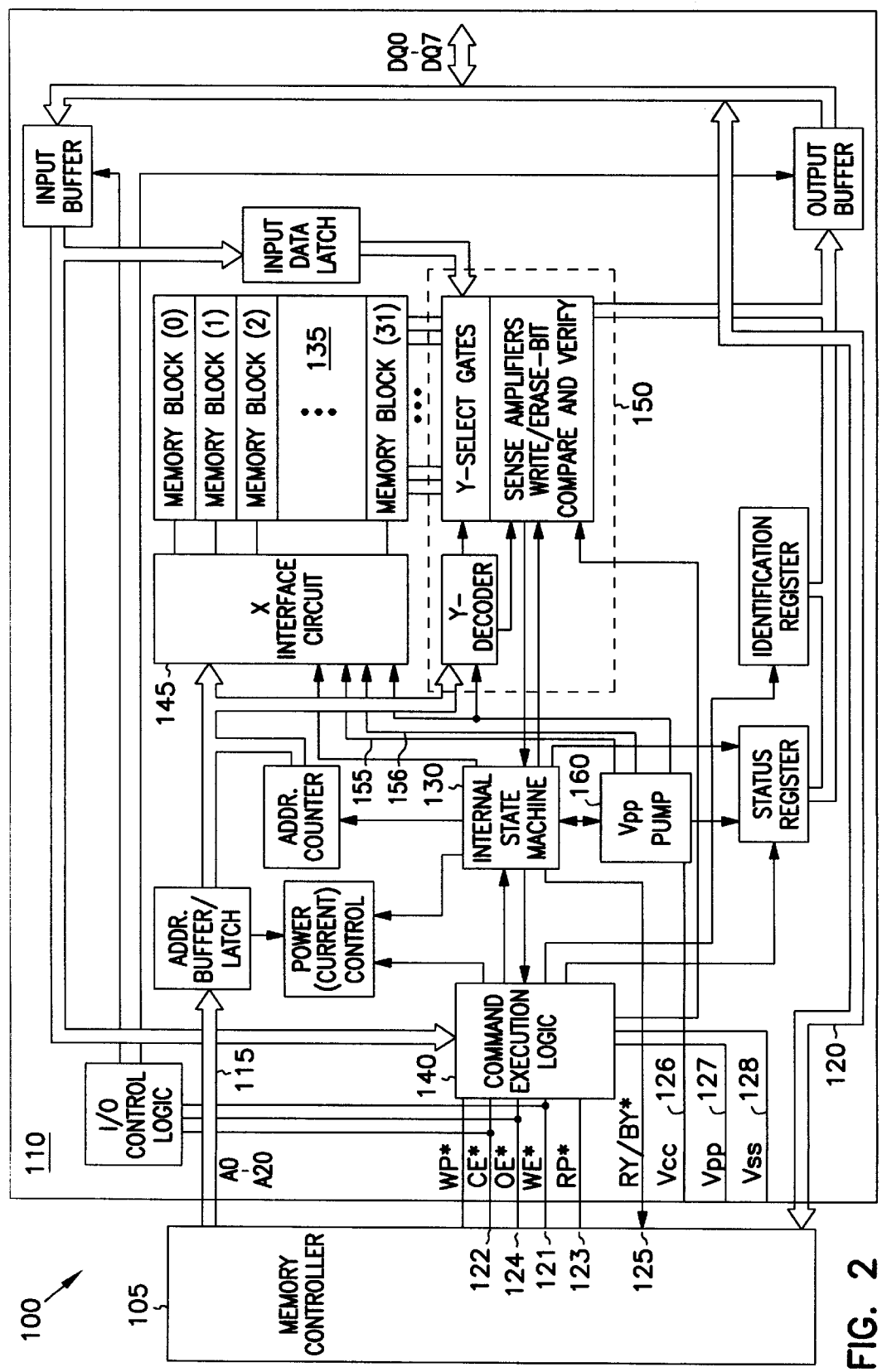
FIG. 2 is a schematic diagram of a memory system according to an embodiment of the present invention.

FIG. 2 is a schematic diagram illustrating a memory system 100 according to an embodiment of the present invention. The memory system 100 includes a memory controller 105 and a memory integrated circuit (IC) 110. The controller 105 includes a control device such as a microprocessor to provide interface signals to the IC 110. The interface signals include address signals provided over multiple address lines 115, and data signals communicated over multiple data lines 120. Other interface signals provided by the controller 105 include a write enable signal WE* at node 121, a chip enable signal CE* at node 122, a reset/power-down signal RP* at node 123, and an output enable signal OE* at node 124, all of which are active low signals. The IC 110 provides a status signal RY/BY* to the controller 105 at node 125 to indicate the status of an internal state machine 130. The IC 110 also receives a positive power supply voltage $V_{CC}$ at node 126, a write/erase supply (or programming) voltage $V_{PP}$ at node 127, and a reference voltage such as a substrate ground voltage $V_{SS}$ at node 128 which is approximately 0 Volts.

The IC 110 includes an array 135 of floating gate transistor memory cells or flash cells arranged in 32 flash cell blocks. Each block in the array 135 contains 64 kilobytes of flash cells. Data stored in each block is erased independently without disturbing data stored in other blocks. A command execution logic module 140 receives the above-described interface signals from the controller 105. The module 140 controls the state machine 130 which provides write and block erase timing sequences to the array 135 through an X-interface circuit 145 and a Y-interface circuit 150.

The Y-interface circuit 150 provides access to individual flash cells through data lines in the array 135. Data lines in the Y-interface circuit 150 are connected to a bit line driver circuit (not shown). The Y-interface circuit 150 includes a Y-decoder circuit, Y-select gates, sense amplifiers, and write/erase bit compare and verify circuits. The X-interface circuit 145 provides access to rows of flash cells through wordlines in the array 135, which are electrically coupled to the control gates of the flash cells in the array 135. The X-interface circuit 145 includes decoding and control circuits for erasing individual blocks of the flash cells in the array 135.

Figure 3:
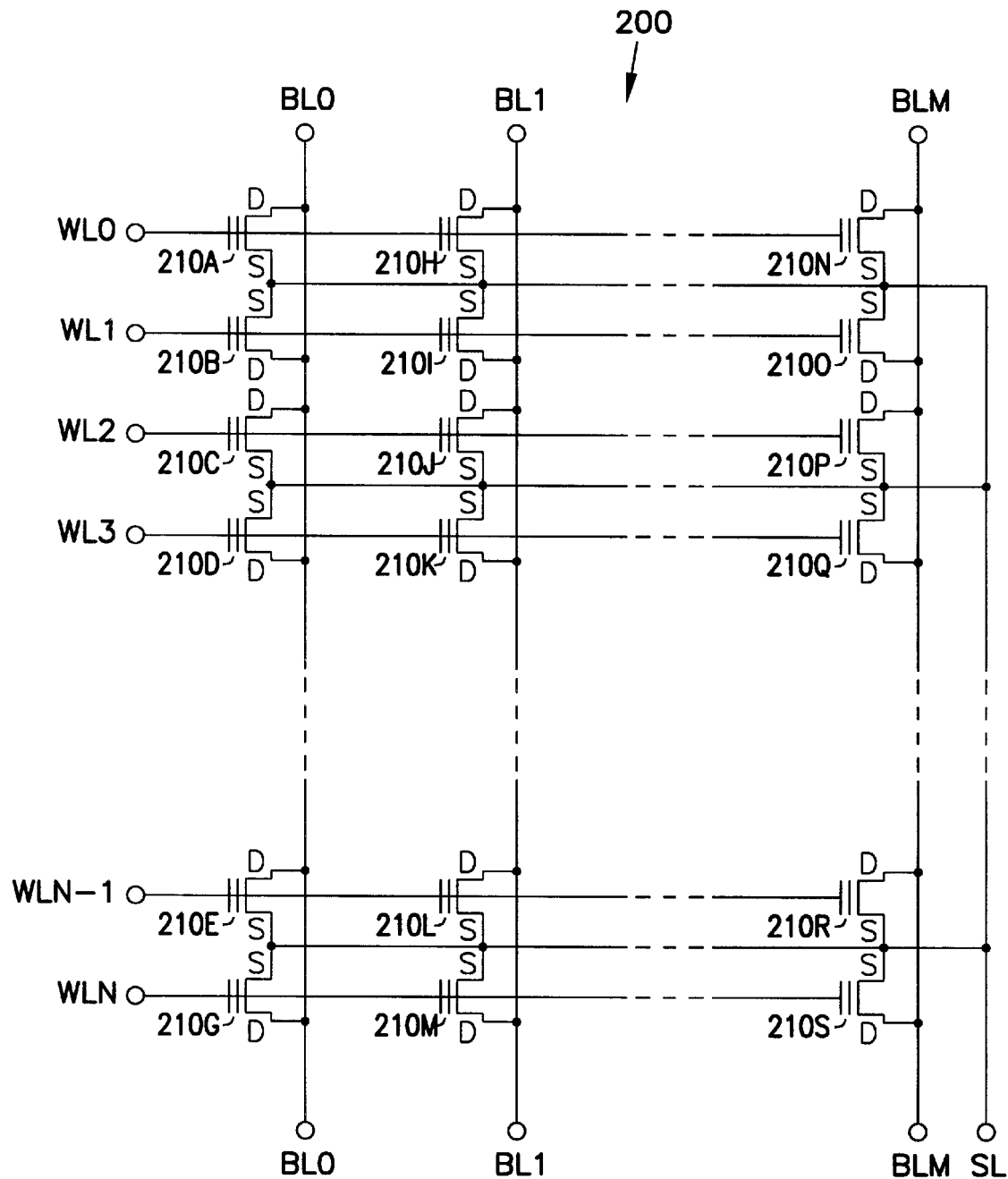
FIG. 3 is a schematic diagram of a block of flash cells in the memory system of FIG. 2.

A representative block 200 of flash cells 210A–210S in the array 135 according to the embodiments of the present invention is shown in FIG. 3. Some flash cells in the block 200 are omitted from FIG. 3 for purposes of clarity. Each flash cell 210 in the block 200 may be a multi-state flash cell capable of holding multiple separate and distinct threshold voltage levels. The flash cells 210 of the block 200 are arranged in rows and columns. All of the flash cells 210 in a particular column have drain regions D connected to a common bit line BL and all of the flash cells 210 in a particular row have control gates connected to a common word line WL. The bit lines are identified as BL0–BLM and the word lines are identified as WE0–WLN. All of the flash cells 210 in the block 200 have source regions S connected to a common source line SL. The remaining flash cells in the array 135 are arranged into separate blocks having separate source lines. The flash cells in separate blocks are sequentially accessed during an erase cycle so as to reduce the required erase current.

The flash cells 210 of the block 200 are arranged in column pairs, with each flash cell 210 of the pair sharing a common source region S. For example, a flash cell pair 210J and 210K have a common source region S connected to the source line SL. The drain regions D of the flash cells 210 are connected to the bit line BL associated with the column in which the flash cells 210 are located. For example, the flash cell pair 210J and 210K have their drain regions D connected to a common bit line BL1.

The flash cells 210A–210S in the block 200 are erased according to the embodiments of the present invention by holding the word lines WL0–WLN to ground or zero volts, allowing the bit lines BL0–BLM to float, and applying a high positive voltage erase pulse, for example 12 volts, to the sources through the source line SL. Electrons in the floating gates are drawn to the source line SL reducing the charge on the floating gate of the flash cells 210A–210S. In an alternate method the flash cells 210A–210S may be erased by applying a very negative voltage for example −10 volts, to the word lines WL0–WLN, and applying a moderate positive voltage erase pulse, for example 5 volts, to the source line SL while the bit lines BL0–BLM remain floating. All of the flash cells 210 in the block 200 are erased at the same time because they are connected to a common source line SL. Flash cells in different blocks with separate source lines SL are erased with separate erase pulses.

The term pulse is used in a broad sense in this description, referring to the application of a selected voltage level to a terminal for a finite time period. Those skilled in the art will understand that a single pulse such as an erase pulse may be applied continuously for the finite time period, or may include a series of shorter discrete pulses applied in sequence and having a summed or total time period equal to the finite time period.

According to the embodiments of the present invention, the flash cells 210A–210S are verified as being erased in an erase verification operation in which they are read individually. A verification of the flash cell 210I will be described as an example. The flash cell 210I is read by holding the source line SL to ground, placing a low positive voltage, for example 1.5 volts, on the bit line BL1, and then raising the voltage on the word line WL1 to 5 volts. If the flash cell 210I has been erased, its threshold voltage will be low and it will be activated and conduct current when 5 volts are applied to its control gate. Current in the flash cell 210I will be detected by a sense amplifier (not shown) connected to the bit line BL1. If the flash cell 210I has not been erased, it will not be activated and conduct current. If the flash cell 210I has been overerased it will leak current into the bit line BL1 even when it is not being read. This leaked current will be detected by the sense amplifier and will indicate, during the erase verification operation, that each flash cell 210 connected to the bit line BL1 has been erased even though some of them have not been erased. The other flash cells 210 are read in a similar manner by applying the above mentioned voltages to the appropriate bit lines BL and word lines WL.

A column with an overerased flash cell 210 that leaks current may be called a leaky column, and can be identified using a sense amplifier to detect current in the column when none of the flash cells 210 in the column are being read. For example, if the sense amplifier connected to the bit line BL1 detects a predetermined amount of current when none of the flash cells 210 connected to the bit line BL1 are being read, then the bit line BL1 is leaky because one of those flash cells 210 is overerased, active, and conducting at least the predetermined amount of current even though it is not being read.

Often a single erase pulse is not sufficient to erase all the flash cells 210 in the block 200. Multiple erase pulses are applied to the block 200 until a sufficient number of flash cells 210 can be verified as erased. Some of the flash cells 210 may be overerased and have an insufficient negative or even a positive charge on their floating gates. A heal operation must then carried out to add negative charge to the floating gates of the overerased flash cells 210. In the heal operation the bit lines BL in the block 200 are left floating and the source line SL is grounded. A high positive voltage pulse, typically 12 volts, called a heal pulse, is applied to all of the word lines WL in the block 200 to draw electrons into the floating gates of the overerased flash cells 210. Methods for performing erase and heal operations according to several embodiments of the present invention will now be described.

Figure 4:
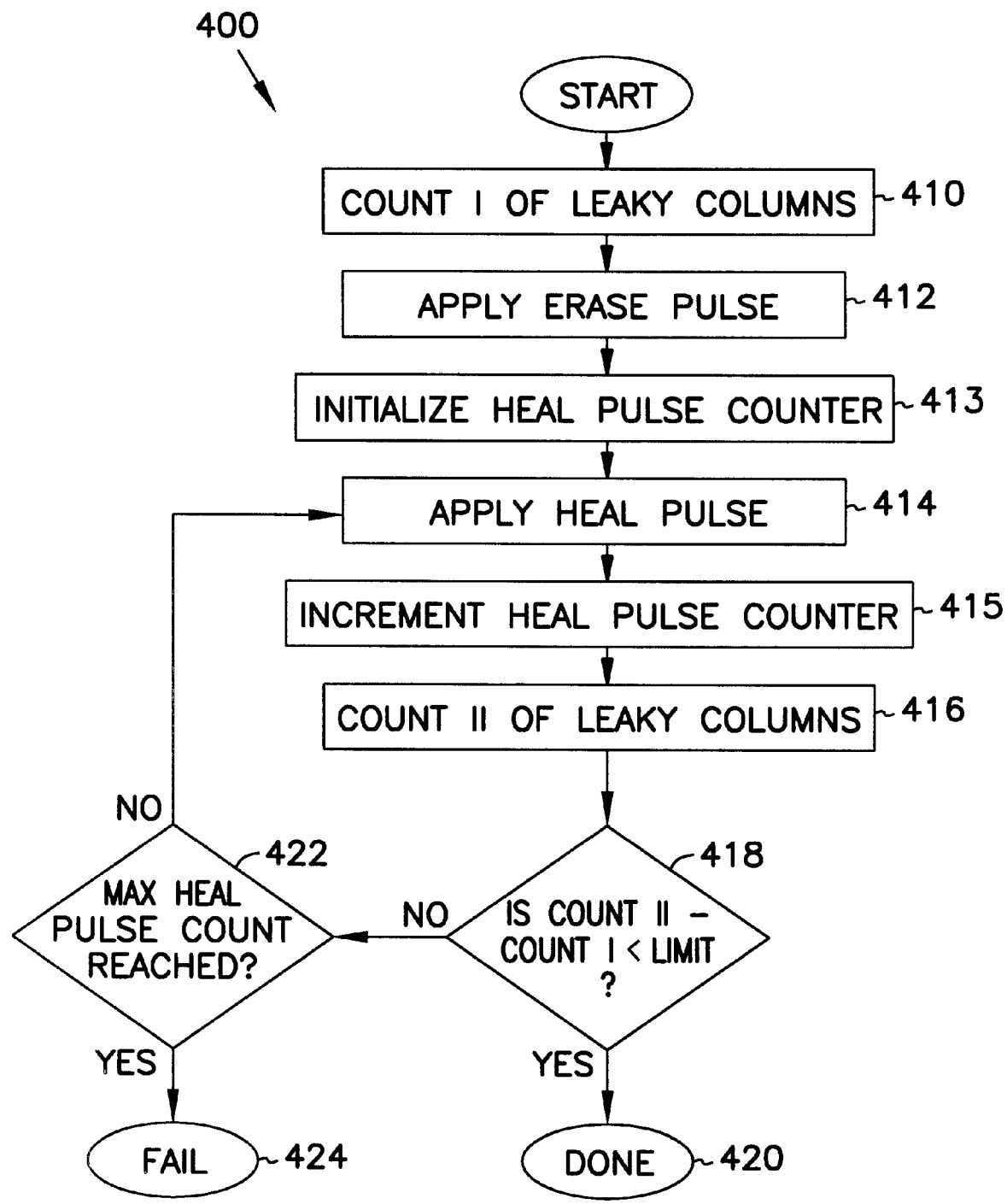
FIG. 4 is a flow chart of a method for erasing a block of flash cells according to an embodiment of the present invention.

FIG. 4 is a flow chart illustrating a method 400 for erasing the flash cells 210 in the block 200 in accordance with an embodiment of the present invention. The method is preferably implemented as a series of programmable instructions stored and implemented in the memory system 100.

In an initial step 410 a first count, count I, of leaky columns in the block 200 is made and count I is stored in a memory. In an alternative embodiment of the present invention the location of the leaky columns is also stored. Next, in step 412 an erase pulse is applied to erase the flash cells 210 in the block 200. The erase pulse is approximately 100 milliseconds, long enough to ensure that all of the flash cells 210 are erased, not just the fast cells. In an alternative embodiment of the present invention, the erase pulse is longer, for example 120 milliseconds. A heal pulse counter is initialized in step 413. In step 414 a heal pulse is applied to all of the flash cells 210, and in step 415 the heal pulse counter is incremented. The heal pulse is relatively short in duration, shorter than the erase pulse. After the heal pulse is completed, a second count, count II, of the number of leaky columns is made and stored in step 416. Count II is compared with count I in step 418. If count II is equal to or less than a predetermined number of columns greater than count I, then the erase operation is completed in step 420. In this case, the number of leaky columns has not substantially increased as a result of the erase pulse. If count II is too large indicating that a significant number of leaky columns remain that were created by the erase pulse in step 412, then the heal pulse counter is checked in step 422. If the heal pulse counter is below a maximum number of allowable heal pulses then another heal pulse is applied in step 414, and steps 415 to 422 are repeated. If the maximum number of heal pulses is reached in step 422 before the number of leaky columns has been sufficiently reduced the method 400 fails in step 424. Heal pulses are reapplied until count II is close enough to count I or a predetermined maximum number of heal pulses have been applied.

Figure 5:
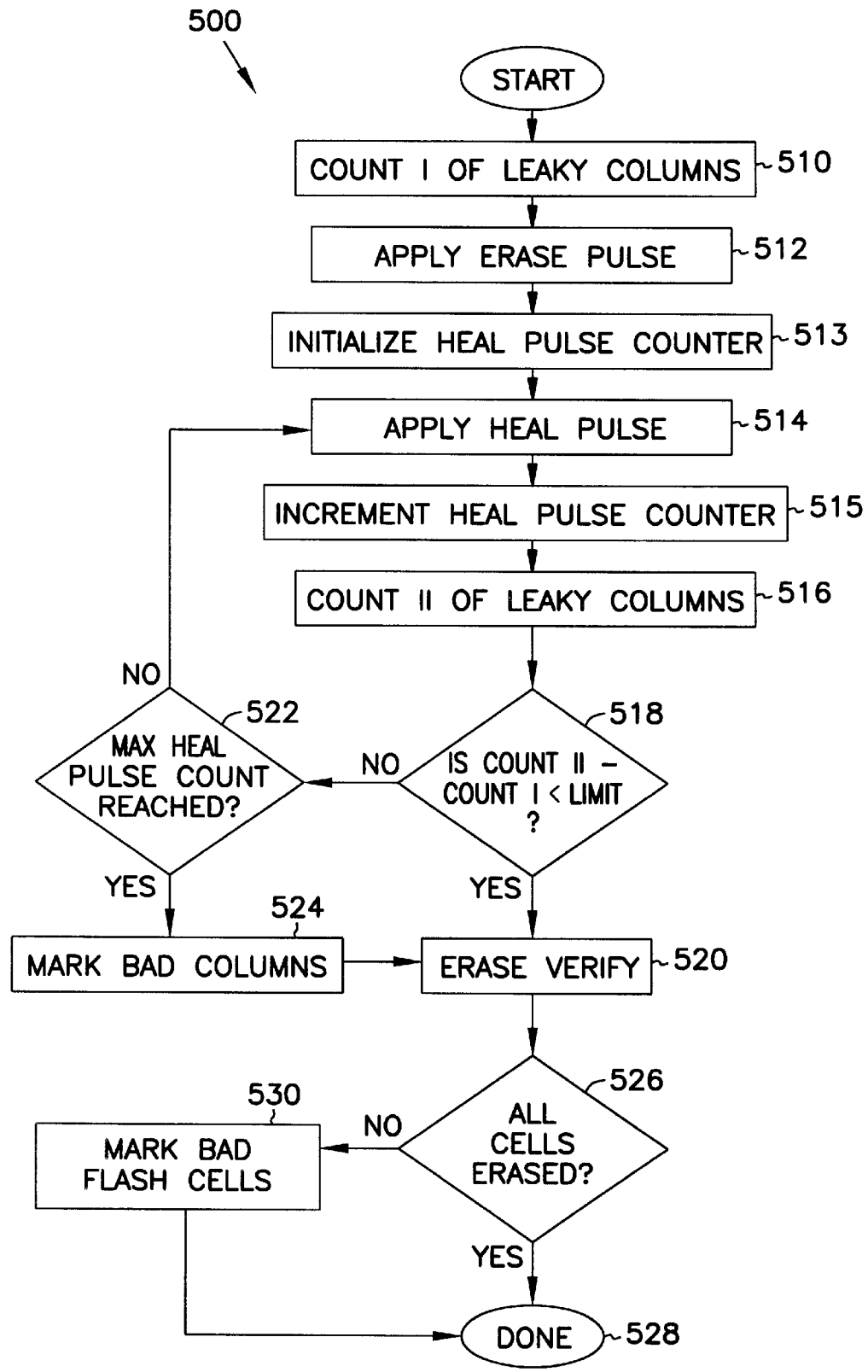
FIG. 5 is a flow chart of a method for erasing a block of flash cells according to an embodiment of the present invention.

A flow chart illustrating a method 500 for erasing the flash cells 210 according to an alternative embodiment of the present invention is illustrated in FIG. 5. The method 500 is preferably implemented as a series of programmable instructions stored and implemented in the memory system 100. Steps 510 through 518 are performed in substantially the same manner as steps 410 through 418 in FIG. 4, and will not be described for purposes of brevity.

Picking up with step 518, if count II is equal to or less than a predetermined number of columns greater than count I, then an erase verify procedure is carried out in step 520. If count II is too large indicating that a significant number of leaky columns remain that were created by the erase pulse in step 512, then the heal pulse counter is checked in step 522. If the heal pulse counter is below a maximum number of allowable heal pulses then another heal pulse is applied in step 514, and steps 515 to 522 are repeated. If the maximum number of heal pulses has been reached in step 522 and there are still an excessive number of leaky columns those columns are marked as bad in step 524 and the method moves to step 520 where the erase verify procedure is carried out. The columns marked as bad are not to be programmed. The results of the erase verify procedure are evaluated in step 526, and if all of the flash cells 210 in the block 200 have been erased then the method ends at step 528. If some of the flash cells 210 in the block 200 have not been erased they are marked as bad flash cells in step 530 and the method ends in step 528.

Figure 6:
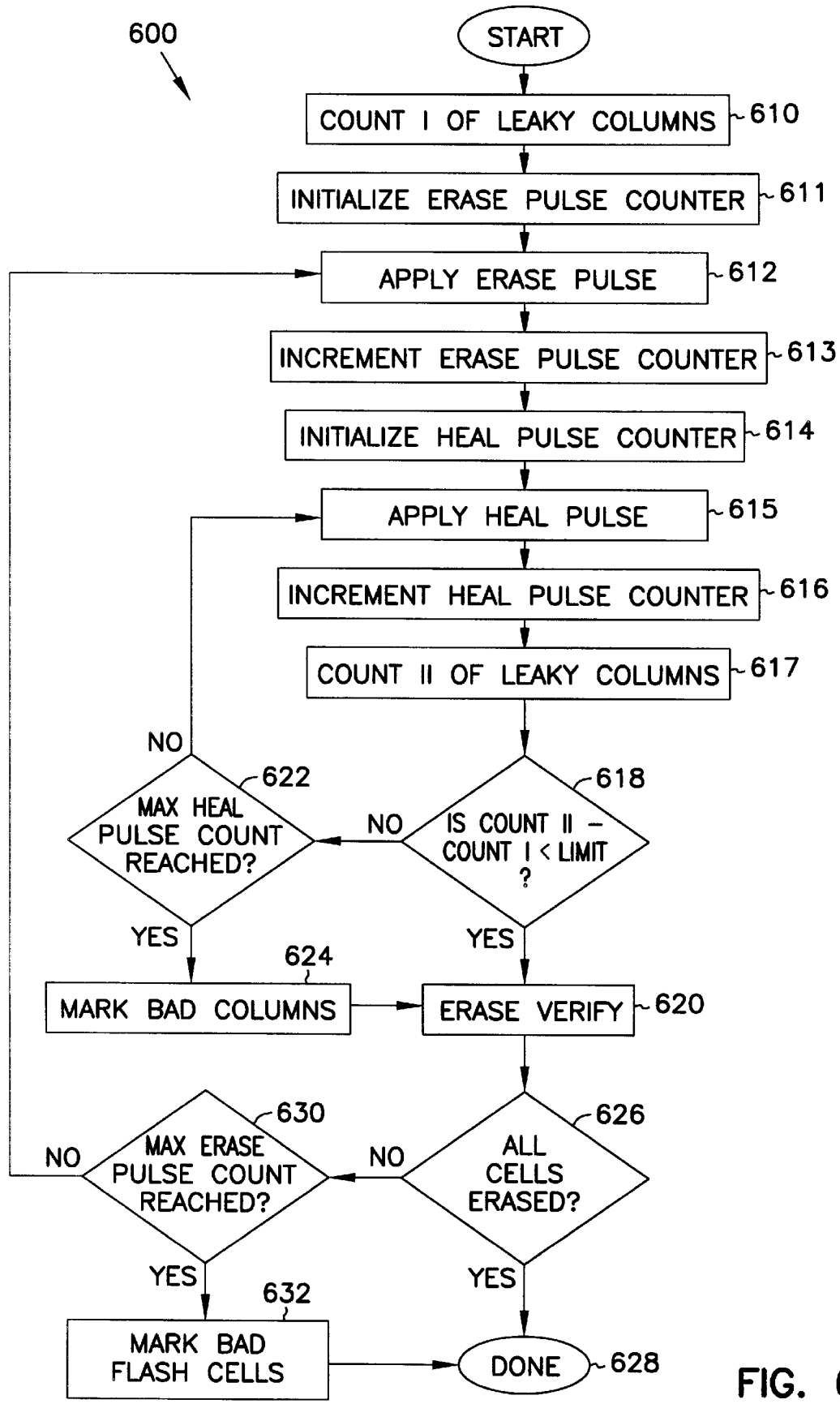
FIG. 6 is a flow chart of a method for erasing a block of flash cells according to an embodiment of the present invention.

A flow chart illustrating a method 600 for erasing the flash cells 210 according to an alternative embodiment of the present invention is illustrated in FIG. 6. The method 600 is preferably implemented as a series of programmable instructions stored and implemented in the memory system 100. Steps 610 to 626 are similar to steps 510 to 526 shown in FIG. 5 with the exception of two added steps. In step 611 an erase pulse counter is initialized and in step 613 the erase pulse counter is incremented. The rest of steps 610 to 626 will not be described in detail for purposes of brevity.

Picking up with step 626, if it is determined in step 626 that all of the flash cells 210 in the block 200 have been erased then the method ends in step 628. If some flash cells 210 remain unerased the erase pulse counter is evaluated in step 630. If the erase pulse counter has not exceeded a maximum number of allowable erase pulses then the method returns to step 612 and another erase pulse is applied. However, if the maximum number of erase pulses have been applied the unerased flash cells 210 are marked in step 632 and the method ends in step 628.

Figure 7:
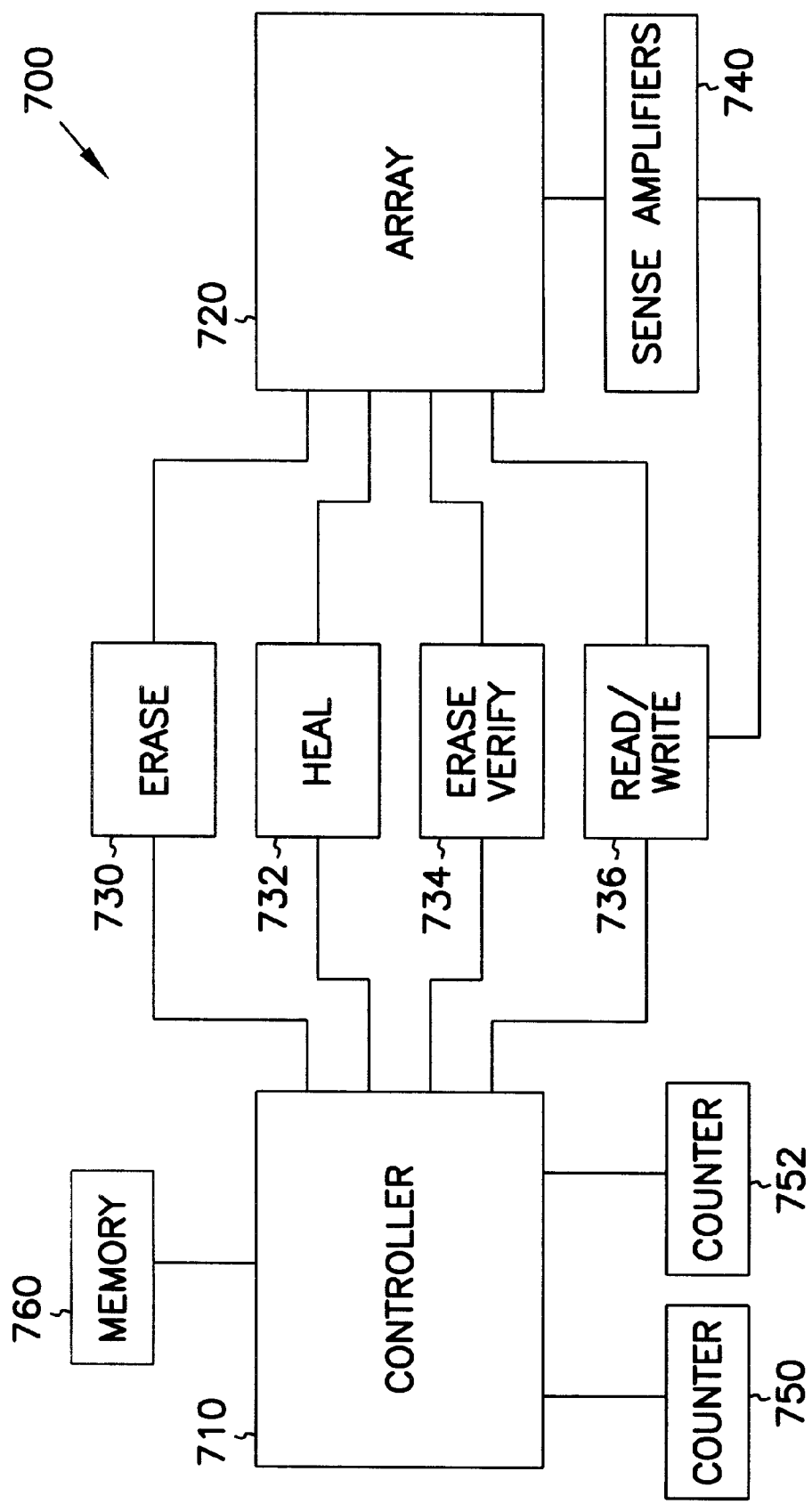
FIG. 7 is a block diagram of a memory system according to an embodiment of the present invention.

FIG. 7 is a block diagram of a memory system 700 according to another embodiment of the invention. A controller 710 is coupled to an array 720 of flash cells through an erase circuit 730, a heal circuit 732, an erase verify circuit 734, and a read/write circuit 736. A number of sense amplifiers 740 are coupled between the array 720 and the read/write circuit 736. Two counters 750, 752 are coupled to the controller 710 as is a memory circuit 760. The functions provided for in the embodiments of the invention shown in FIGS. 2–6 are implemented by the controller 710, the array 720, the erase circuit 730, the heal circuit 732, the erase verify circuit 734, the read/write circuit 736, the sense amplifiers 740, the counters 750, 752, and the memory circuit 760 which are suitably coupled together by lines allowing instructions and data to pass between these elements. For example, the flash cells in the array 720 are erased by the erase circuit 730, receive a heal pulse from the heal circuit 732, and are verified as being erased by the erase verify circuit 734 at the direction of the controller 710. In other operations the controller 710 writes data to and reads data from the array 720 through the read/write circuit 736 and the sense amplifiers 740. The controller 710 uses the counters 750, 752 and the memory circuit 760 for storing data when implementing the embodiments of the invention shown in FIGS. 4–6. The memory circuit 760 may be a cache memory or another type of memory, and the controller 710 may use the flash cells in the array 720 instead of the memory circuit 760 for storing data. In other embodiments of the invention the elements shown in FIG. 7 are connected in different arrangements.

The controller 710, the erase circuit 730, the heal circuit 732, the erase verify circuit 734, the read/write circuit 736, the sense amplifiers 740, the counters 750, 752, and the memory circuit 760 are implemented in alternative embodiments of the invention by hardwired logic, a Field Programmable Gate Array (FPGA), a hardwired FPGA, programmable logic, a programmable microcontroller, an Application Specific Integrated Circuit (ASIC), a Read Only Memory (ROM), or a sequencer, or any suitable combination thereof.

Figure 8:
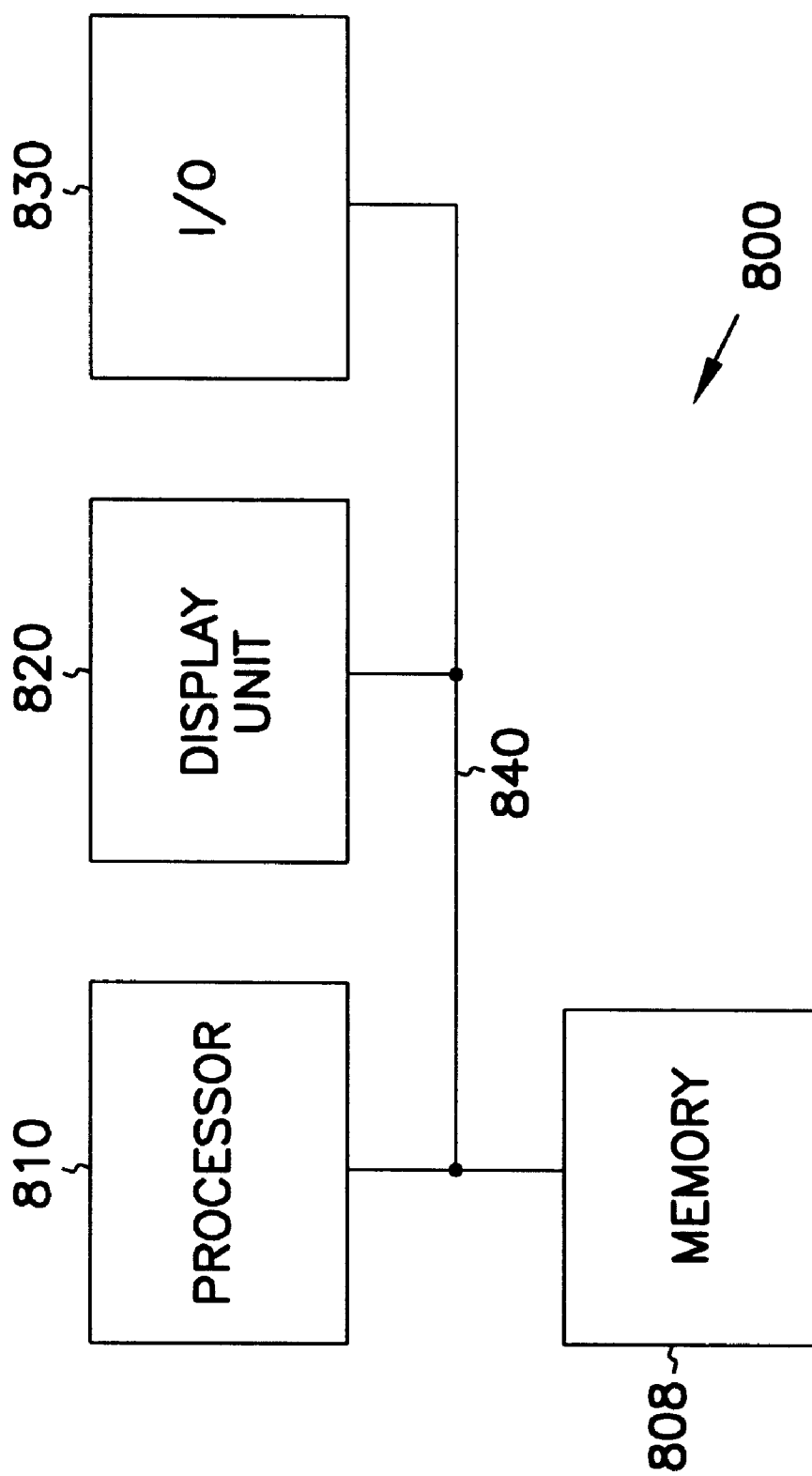
FIG. 8 is a block diagram of an information-handling system according to an embodiment of the present invention.

FIG. 8 is a block diagram of an information-handling system 800 according to an embodiment of the present invention. The information-handling system 800 includes a memory system 808, a processor 810, a display unit 820, and an input/output (I/O) subsystem 830. The memory system 808 is comprised of either the memory system 100 as described in FIG. 2 above, or the memory system 700 as described in FIG. 7 above. The processor 810, the display unit 820, the I/O subsystem 830, and the memory system 808 are coupled together by a suitable communication line or bus 840. In various embodiments, the information-handling system 800 is a computer system (such as, for example, a video game, a handheld calculator, a personal computer, or a multiprocessor supercomputer), an information appliance (such as, for example, a cellular telephone, a pager, or a daily planner or organizer), an information component (such as, for example, a magnetic disk drive or telecommunications modem), or other appliance (such as, for example, a hearing aid, washing machine or microwave oven having an electronic controller). In alternate embodiments of the invention, the display unit 820, the I/O subsystem 830, or both include the memory system 100 as described in FIG. 2 above, or the memory system 700 as described in FIG. 7 above.

Each of the methods described according to embodiments of the present invention carry out the erasure of flash cells and accommodate the existence of fast cells in the memory system 100 or the memory system 700. The methods ensure that all of the flash cells 210 are erased with a sufficiently long erase pulse, even if there are a few fast cells in the block 200. The fast cells therefore do not leak current and do not cause unerased flash cells to be identified as erased flash cells. The methods also correct overerased flash cells and minimize the occurrence of overheated cells by sufficiently erasing all of the flash cells and by applying short heal pulses repeatedly until the number of leaky columns created by the erase pulse is reduced to a minimum or eliminated.

Although the present invention has been described with reference to preferred embodiments, those skilled in the art will recognize that changes may be made in form and detail without departing from the spirit and scope of the present invention. The scope of the present invention is defined only by the appended claims and their equivalents.

What is claimed is:

1. A method for healing cells in a memory device comprising:

performing a heal operation on a plurality of cells in the memory device;

counting a number of subsets of the cells that are leaking wherein a subset of cells that is leaking includes a cell that conducts more than a predetermined amount of current when not being activated; and performing another heal operation on the cells based on the number of subsets of the cells that are leaking.

2. The method of claim 1 wherein performing a heal operation comprises applying a heal pulse to flash cells in a block in the memory device after the flash cells in the block have been erased.

3. The method of claim 2 wherein counting a number of subsets comprises counting a number of columns of the flash cells in the block that are leaking, the block comprising a plurality of columns of the flash cells, each column comprising a plurality of the flash cells connected to a line, and each column that is leaking includes a flash cell that conducts more than the predetermined amount of current when not being activated.

4. The method of claim 3 wherein performing another heal operation comprises applying another heal pulse to the flash cells in the block if the number of columns that are leaking is greater by a predetermined number than a number of the columns that were leaking before the flash cells in the block were erased.

5. A method for erasing a plurality of cells in a memory device comprising:

counting a first number of the cells that conduct more than a predetermined amount of current when not being activated;

erasing the cells;

healing the cells;

counting a second number of the cells that conduct more than the predetermined amount of current when not being activated; and healing the cells again if the second number of the cells is greater by a first predetermined number than the first number of the cells.

6. The method of claim 5 wherein:

erasing the cells comprises removing charge from floating gates of flash cells in a block in the memory device; and healing the cells comprises adding charge to the floating gates of the flash cells in the block.

7. The method of claim 6 wherein:

erasing the cells further comprises applying an erase pulse to the flash cells in the block; and healing the cells further comprises applying a heal pulse to the flash cells in the block.

8. The method of claim 5 wherein:

counting a first number of the cells comprises counting a first number of columns of flash cells in a block in the memory device that include a flash cell that conducts more than the predetermined amount of current when not being activated;

counting a second number of the cells comprises counting a second number of the columns that include a flash cell that conducts more than the predetermined amount of current when not being activated; and healing the cells again comprises adding charge to floating gates of the flash cells in the block if the second number of the columns is greater by a second predetermined number than the first number of the columns.

9. A method for erasing a plurality of floating gate transistor memory cells arranged in rows and columns in a memory device comprising:

counting a first number of columns having a cell that conducts more than a predetermined amount of current when not being activated;

removing charge from floating gates of the cells to erase the cells;

adding charge to the floating gates of the cells to heal the cells;

counting a second number of columns having a cell that conducts more than the predetermined amount of current when not being activated; and adding charge to the floating gates of the cells if the second number of columns is greater by a predetermined number than the first number of columns.

10. The method of claim 9 wherein:

removing charge comprises applying an erase pulse to the cells; and adding charge comprises applying a heal pulse to the cells.

11. The method of claim 9, further comprising:

adding charge to the floating gates of the cells an additional number of times until the second number of columns is greater than the first number of columns by less than the predetermined number; and terminating the addition of charge to the floating gates of the cells when charge has been added to the floating gates of the cells a first maximum number of times.

12. The method of claim 11, further comprising:

identifying and storing the identity of the columns counted in the second number of columns;

performing an erase verify operation for the cells to identify cells that are not erased;

removing charge from the floating gates of the cells to erase the cells and performing an erase verify operation for the cells an additional number of times if a selected number of cells or more than the selected number of cells are identified as not erased;

terminating the removal of charge from the floating gates of the cells after charge has been removed from the floating gates of the cells a second maximum number of times; and storing the identity of the cells that are identified as not erased.

13. The method of claim 12 wherein performing an erase verify operation comprises:

reading each cell;

identifying erased cells by detecting current greater than or equal to a predetermined amount of current in a cell being read indicating that the cell being read is active; and identifying cells that are not erased by detecting less than the predetermined amount of current in a cell being read indicating that the cell being read is not active.

14. A method for erasing a plurality of cells in a memory device comprising:

counting a first number of subsets of the cells that are leaking wherein a subset of cells that is leaking includes a cell that conducts more than a predetermined amount of current when not being activated;

performing an erase operation on the cells;

performing a heal operation on the cells;

counting a second number of subsets of the cells that are leaking;

repeating the heal operation on the cells if the second number of subsets is greater by a predetermined number than the first number of subsets;

terminating the performance of the heal operation if the heal operation has been performed a first maximum number of times; and performing an erase verify operation for the cells.

15. The method of claim 14 wherein:

counting a first number of subsets comprises counting a first number of columns having a cell that conducts more than a predetermined amount of current when not being activated, the cells comprising floating gate transistor memory cells arranged in rows and columns in the memory device and each column comprising a plurality of the cells coupled to a line;

performing an erase operation comprises removing charge from floating gates of the cells to erase the cells;

performing a heal operation comprises adding charge to the floating gates of the cells to heal the cells; and counting a second number of subsets comprises counting a second number of columns having a cell that conducts more than the predetermined amount of current when not being activated.

16. The method of claim 15, further comprising:

identifying and storing the identity of the columns counted in the second number of columns;

identifying cells that are not erased in the erase verify operation;

removing charge from the floating gates of the cells to erase the cells and performing the erase verify operation for the cells an additional number of times if more than a selected number of the cells are identified as not erased;

terminating the removal of charge from the floating gates of the cells after charge has been removed from the floating gates of the cells a second maximum number of times; and storing the identity of the cells that are identified as not erased.

17. The method of claim 15 wherein:

performing an erase operation further comprises applying an erase pulse to the cells; and performing a heal operation further comprises applying a heal pulse to the cells.

18. The method of claim 14 wherein performing an erase verify operation comprises:

reading each cell;

identifying erased cells by detecting current greater than or equal to a predetermined amount of current in a cell being read indicating that the cell being read is active; and identifying cells that are not erased by detecting less than the predetermined amount of current in a cell being read indicating that the cell being read is not active.

19. A memory device comprising:

a plurality of cells; and a controller such that the controller:

performs a heal operation on the cells;

counts a number of subsets of the cells that are leaking wherein a subset of cells that is leaking includes a cell that conducts more than a predetermined amount of current when not being activated; and performs another heal operation on the cells based on the number of subsets of the cells that are leaking.

20. The memory device of claim 19 wherein:

the cells comprise flash cells in a block in the memory device; and when the controller performs a heal operation the controller applies a heal pulse to the flash cells after applying an erase pulse to the flash cells to erase the flash cells.

21. The memory device of claim 20 wherein:

the flash cells are arranged in rows and columns, each column comprising a plurality of the flash cells connected to a line; and when the controller counts a number of subsets the controller counts a number of columns that are leaking, each column that is leaking includes a flash cell that conducts more than the predetermined amount of current when not being activated.

22. The memory device of claim 21 wherein when the controller performs another heal operation the controller applies another heal pulse to the flash cells if the number of columns that are leaking is greater by a predetermined number than a number of the columns that were leaking before the flash cells were erased.

23. A memory device comprising:

a plurality of cells; and control circuitry programmed to:

count a first number of the cells that conduct more than a predetermined amount of current when not being activated;

erase the cells;

heal the cells;

count a second number of the cells that conduct more than the predetermined amount of current when not being activated; and heal the cells again if the second number of the cells is greater by a predetermined number than the first number of the cells.

24. The memory device of claim 23 wherein:

the cells comprise a plurality of flash cells in a block in the memory device;

where the control circuitry is programmed to erase the cells the control circuitry is programmed to remove charge from floating gates of the flash cells; and where the control circuitry is programmed to heal the cells the control circuitry is programmed to add charge to the floating gates of the flash cells.

25. The memory device of claim 24 wherein:

the flash cells are arranged in rows and columns, each column comprising a plurality of the flash cells connected to a line;

where the control circuitry is programmed to count a first number of the cells the control circuitry is programmed to count a first number of the columns of flash cells that include a flash cell that conducts more than the predetermined amount of current when not being activated;

where the control circuitry is programmed to count a second number of the cells the control circuitry is programmed to count a second number of the columns that include a flash cell that conducts more than the predetermined amount of current when not being activated; and where the control circuitry is programmed to heal the cells again the control circuitry is programmed to add charge to the floating gates of the flash cells if the second number of the columns is greater by a second predetermined number than the first number of the columns.

26. A memory device comprising:

an array of floating gate transistor memory cells arranged in rows and columns;

a controller such that the controller:

counts a first number of columns having a cell that conducts more than a predetermined amount of current when not being activated;

removes charge from floating gates of the cells to erase the cells;

adds charge to the floating gates of the cells to heal the cells;

counts a second number of columns having a cell that conducts more than the predetermined amount of current when not being activated; and adds charge to the floating gates of the cells if the second number of columns is greater by a predetermined number than the first number of columns.

27. The memory device of claim 26 wherein the controller:

adds charge to the floating gates of the cells an additional number of times until the second number of columns is greater than the first number of columns by less than the predetermined number; and terminates the addition of charge to the floating gates of the cells when charge has been added to the floating gates of the cells a first maximum number of times.

28. The memory device of claim 27 wherein the controller:

identifies and stores the identity of the columns counted in the second number of columns;

performs an erase verify operation for the cells;

removes charge from the floating gates of the cells to erase the cells and performs an erase verify operation for the cells an additional number of times if a selected number of cells or more than the selected number of cells are identified as not erased;

terminates the removal of charge from the floating gates of the cells after charge has been removed from the floating gates of the cells a second maximum number of times; and identifies cells that are not erased during the erase verify operation and stores the identity of the cells that are identified as not erased.

29. The memory device of claim 28 wherein when the controller performs an erase verify operation the controller:

reads each cell;

identifies erased cells by detecting current greater than or equal to a predetermined amount of current in a cell being read indicating that the cell being read is active; and identifies cells that are not erased by detecting less than the predetermined amount of current in a cell being read indicating that the cell being read is not active.

30. A memory device comprising:

a plurality of cells;

means for determining a first number of leaky columns in the memory device;

means for erasing the cells;

means for determining a second number of leaky columns in the memory device; and means for healing the cells incrementally based on a difference between the second number of leaky columns and the first number of leaky columns to minimize a number of overheated cells.

31. A memory device comprising:

a plurality of cells;

a heal circuit to perform a heal operation on the cells;

a counter to count a number of subsets of the cells that are leaking wherein a subset of cells that is leaking includes a cell that conducts more than a predetermined amount of current when not being activated; and wherein the heal circuit may perform another heal operation on the cells based on the number of subsets of the cells that are leaking.

32. The memory device of claim 31, further comprising an erase circuit to perform an erase operation on the cells.

33. The memory device of claim 32 wherein:

the cells comprise a plurality of flash cells in a block in the memory device; and the heal circuit may apply a heal pulse to the flash cells after the flash cells in the block have been erased by the erase circuit.

34. The memory device of claim 33 wherein:

the flash cells are arranged in rows and columns, each column comprising a plurality of the flash cells connected to a line; and the counter may count a number of columns of flash cells in the block that are leaking wherein each column that is leaking includes a flash cell that conducts more than the predetermined amount of current when not being activated.

35. The memory device of claim 34 wherein the heal circuit may apply another heal pulse to the flash cells in the block if the number of columns that are leaking is greater by a predetermined number than a number of the columns that were leaking before the flash cells in the block were erased.

36. A system comprising:

a processor; and a memory device comprising:

a plurality of floating gate transistor memory cells arranged in rows and columns;

a first counter to count a first number of columns having a cell that conducts more than a predetermined amount of current when not being activated;

an erase circuit to remove charge from floating gates of the cells to erase the cells;

a heal circuit to add charge to the floating gates of the cells to heal the cells;

a second counter to count a second number of columns having a cell that conducts more than the predetermined amount of current when not being activated; and wherein the heal circuit may add charge to the floating gates of the cells if the second number of columns is greater by a predetermined number than the first number of columns.

37. The system of claim 36 wherein:

the heal circuit may add charge to the floating gates of the cells an additional number of times until the second number of columns is greater than the first number of columns by less than the predetermined number; and the heal circuit may terminate the addition of charge to the floating gates of the cells when charge has been added to the floating gates of the cells a first maximum number of times.

38. The system of claim 37 wherein the memory device further comprises:

a memory to store the identity of the columns counted in the second number of columns;

an erase verify circuit to perform an erase verify operation for the cells and to identify cells that are not erased;

wherein the erase circuit may remove charge from the floating gates of the cells to erase the cells and the erase verify circuit may perform an erase verify operation for the cells an additional number of times if a selected number of cells or more than the selected number of cells are identified as not erased;

wherein the erase circuit may terminate the removal of charge from the floating gates of the cells after charge has been removed from the floating gates of the cells a second maximum number of times; and wherein the memory may store the identity of the cells that are identified as not erased.

39. The system of claim 36, further comprising:

a display unit;

an input/output device; and a bus.

40. A system comprising:

a processor; and a memory device comprising:

a plurality of cells; and a controller such that the controller:
- counts a first number of the cells that conduct more than a predetermined amount of current when not being activated;
- erases the cells;
- heals the cells;
- counts a second number of the cells that conduct more than the predetermined amount of current when not being activated; and
- heals the cells again if the second number of the cells is greater by a first predetermined number than the first number of the cells.

41. The system of claim 40 wherein:

the cells comprise a plurality of flash cells in a block in the memory device;

when the controller erases the cells the controller removes charge from floating gates of the flash cells; and when the controller heals the cells the controller adds charge to the floating gates of the flash cells.

42. The system of claim 41 wherein:

the flash cells are arranged in rows and columns, each column comprising a plurality of the flash cells connected to a line;

when the controller counts a first number of the cells the controller counts a first number of the columns of flash cells that include a flash cell that conducts more than the predetermined amount of current when not being activated;

when the controller counts a second number of the cells the controller counts a second number of the columns that include a flash cell that conducts more than the predetermined amount of current when not being activated; and when the controller heals the cells again the controller adds charge to the floating gates of the flash cells if the second number of the columns is greater by a second predetermined number than the first number of the columns.

43. The system of claim 40, further comprising:

a display unit;

an input/output device; and a bus.

* * * * *

UNITED STATES PATENT AND TRADEMARK OFFICE
CERTIFICATE OF CORRECTION

PATENT NO. : 6,115,291
DATED : September 5, 2000
INVENTOR(S) : Lakhani

It is certified that error appears in the above-identified patent and that said Letters Patent is hereby corrected as shown below:

Column 2:
Line 45, delete "overheated" and insert --overhealed-- therefor.

Column 3:
Line 55, delete "overheated" and insert --overhealed-- therefor.
Line 56, delete "overheated" and insert --overhealed-- therefor.
Line 59, delete "overheated" and insert --overhealed-- therefor.

Column 5:
Line 27, delete "2101" and insert --2101-- therefor.

Column 8:
Line 31, delete "overheated" and insert --overhealed-- therefor.

Signed and Sealed this

Twelfth Day of June, 2001

*Attest:*

Nicholas P. Godici

NICHOLAS P. GODICI
*Attesting Officer*   Acting Director of the United States Patent and Trademark Office